United States Patent
Chen et al.

(10) Patent No.: US 9,362,124 B2
(45) Date of Patent: Jun. 7, 2016

(54) METHOD OF PATTERNING A METAL GATE OF SEMICONDUCTOR DEVICE

(71) Applicant: Taiwan Semiconductor Manufacturing Company, Ltd., Hsin-Chu (TW)

(72) Inventors: Chien-Hao Chen, Chuangwei Township (TW); Shun Wu Lin, Taichung (TW); Chi-Chun Chen, Kaohsiung (TW); Ryan Chia-Jen Chen, Chiayi (TW); Yi-Hsing Chen, Changhua (TW); Matt Yeh, Hsinchun (TW); Donald Y. Chao, Hsinchu (TW); Kuo-Bin Huang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/673,024

(22) Filed: Mar. 30, 2015

(65) Prior Publication Data
US 2015/0206755 A1    Jul. 23, 2015

Related U.S. Application Data

(60) Continuation of application No. 13/745,446, filed on Jan. 18, 2013, now Pat. No. 8,993,452, which is a division of application No. 12/371,672, filed on Feb. 16, 2009, now Pat. No. 8,357,617.

(60) Provisional application No. 61/091,159, filed on Aug. 22, 2008.

(51) Int. Cl.
| | |
|---|---|
| *H01L 21/302* | (2006.01) |
| *H01L 21/28* | (2006.01) |
| *H01L 21/311* | (2006.01) |
| *H01L 21/3213* | (2006.01) |
| *H01L 29/40* | (2006.01) |

(52) U.S. Cl.
CPC .... *H01L 21/28105* (2013.01); *H01L 21/28123* (2013.01); *H01L 21/28158* (2013.01); *H01L 21/31111* (2013.01); *H01L 21/32139* (2013.01); *H01L 29/401* (2013.01)

(58) Field of Classification Search
CPC .................................................. H01L 21/28105
USPC ......................................................... 438/745
See application file for complete search history.

(56) References Cited

U.S. PATENT DOCUMENTS

| 6,524,964 B2 | 2/2003 | Yu et al. |
| 6,762,133 B1 | 7/2004 | Rangarajan et al. |

(Continued)

FOREIGN PATENT DOCUMENTS

CN          1624897          6/2005

OTHER PUBLICATIONS

CIPO, Office Action, Application No. 200910167343.6, Mar. 12, 2012, 4 pgs.

*Primary Examiner* — Ajay K Arora
(74) *Attorney, Agent, or Firm* — Haynes and Boone, LLP

(57) ABSTRACT

Provided are methods of patterning metal gate structures including a high-k gate dielectric. In an embodiment, a soluble hard mask layer may be used to provide a masking element to pattern a metal gate. The soluble hard mask layer may be removed from the substrate by water or a photoresist developer. In an embodiment, a hard mask including a high-k dielectric is formed. In a further embodiment, a protection layer is formed underlying a photoresist pattern. The protection layer may protect one or more layers formed on the substrate from a photoresist stripping process.

20 Claims, 8 Drawing Sheets

(56) References Cited

U.S. PATENT DOCUMENTS

| | | |
|---|---|---|
| 6,777,340 B1 | 8/2004 | Chiu et al. |
| 6,833,327 B2 * | 12/2004 | Ishikawa ........... H01L 29/78621 257/E27.111 |
| 6,869,981 B2 | 3/2005 | Fewkes et al. |
| 7,482,280 B2 | 1/2009 | Chang et al. |
| 7,863,169 B2 | 1/2011 | Zhu et al. |
| 7,902,066 B2 | 3/2011 | Ye et al. |
| 8,283,258 B2 | 10/2012 | Raghu et al. |
| 8,357,617 B2 | 1/2013 | Yeh et al. |
| 2013/0130488 A1 | 5/2013 | Yeh et al. |

* cited by examiner

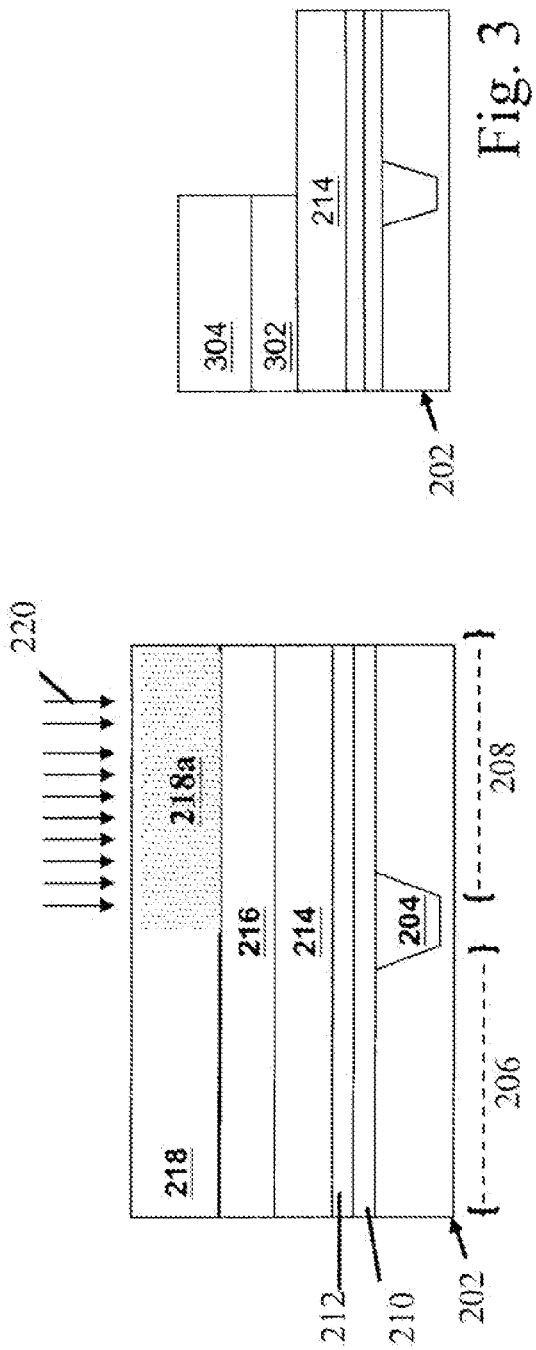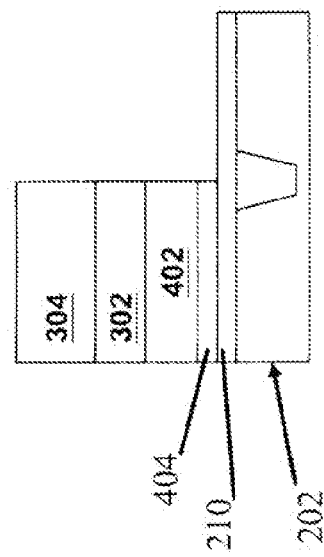

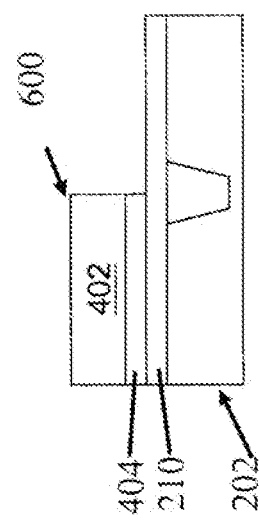

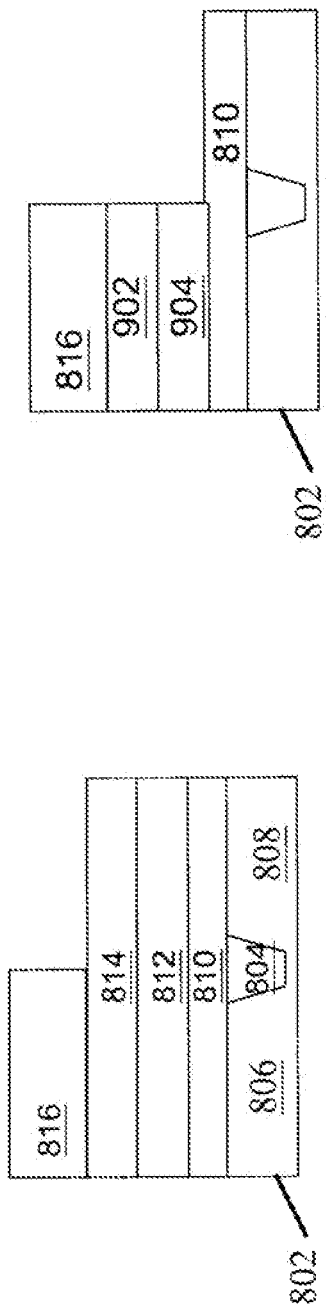
Fig. 8
Fig. 9
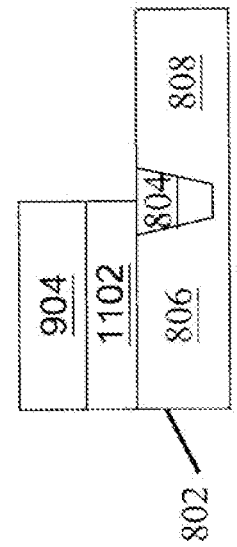
Fig. 10
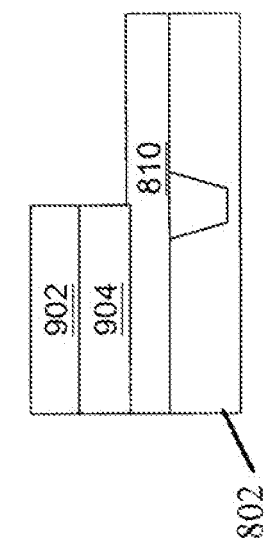
Fig. 11

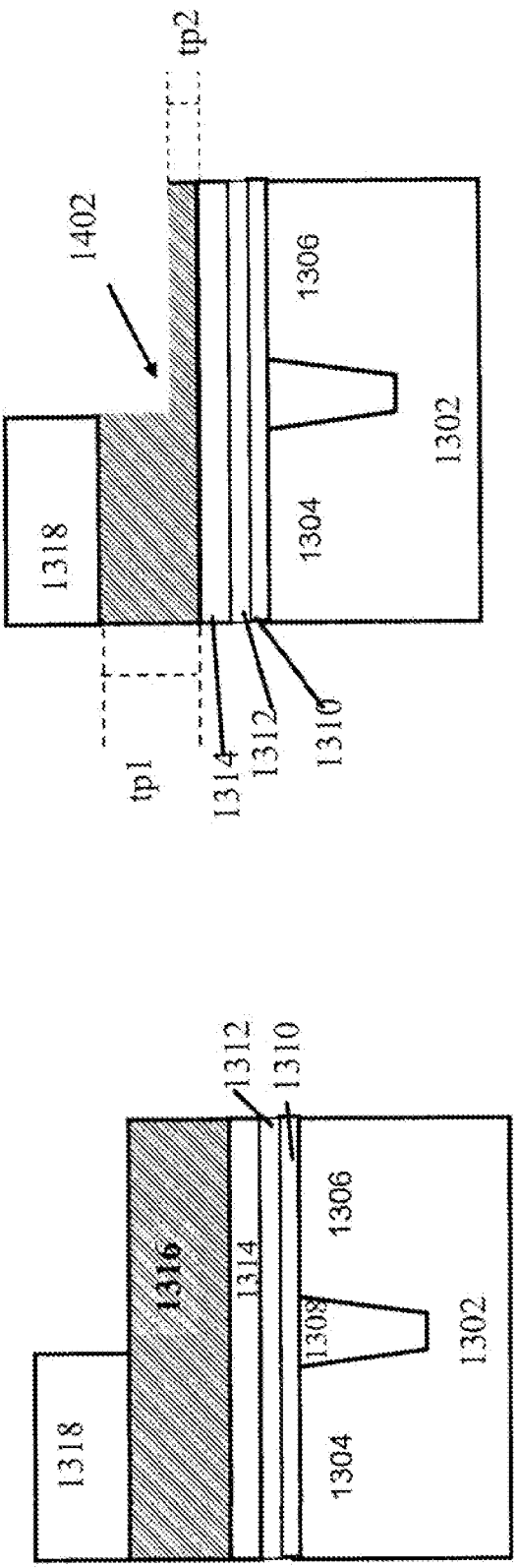
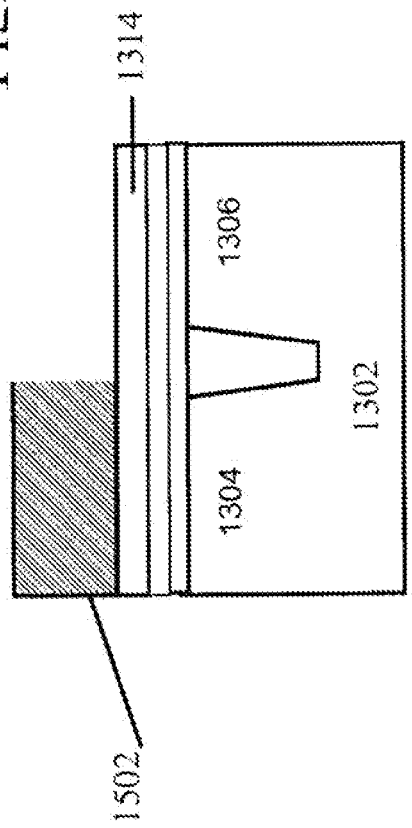
Fig. 14
Fig. 15
Fig. 13

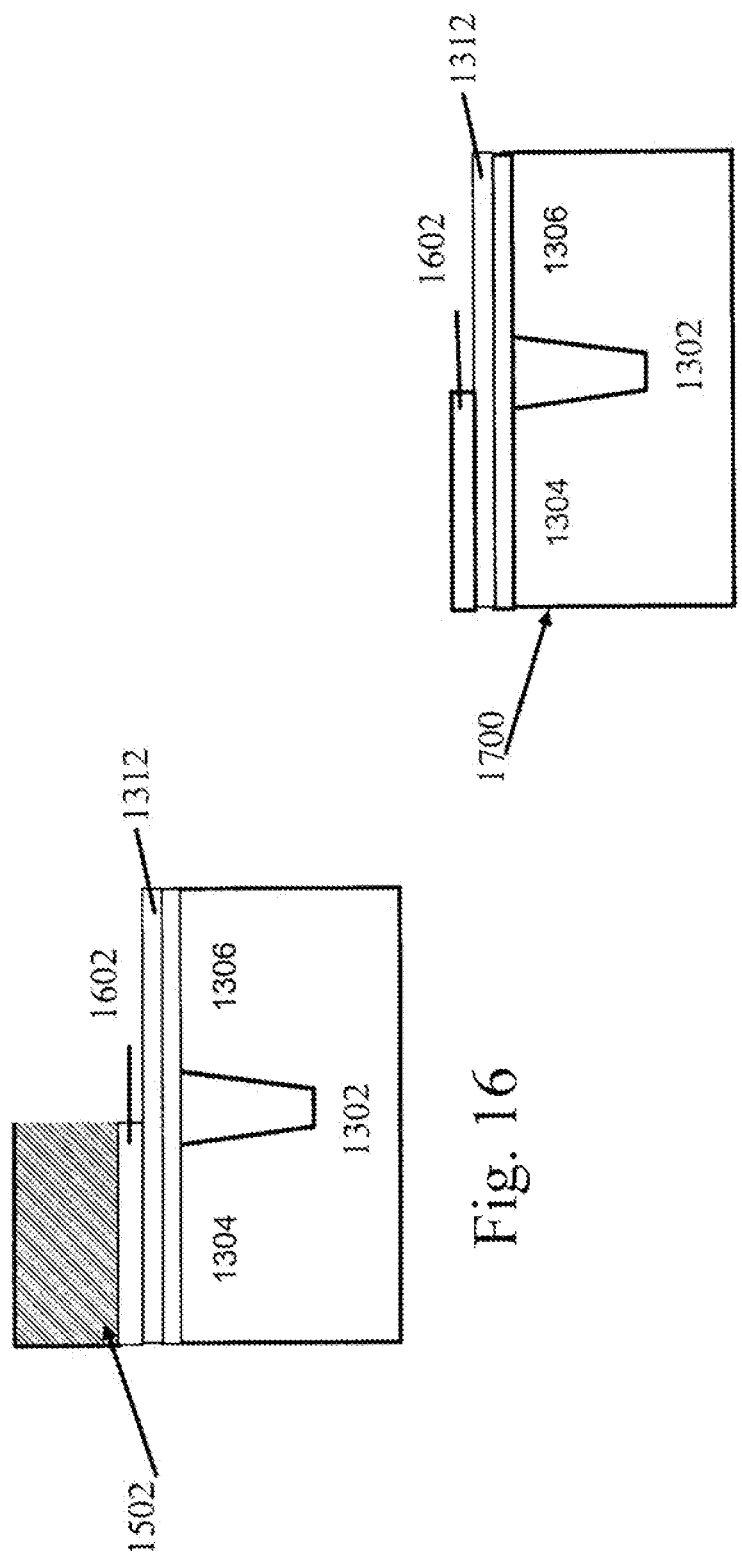

METHOD OF PATTERNING A METAL GATE OF SEMICONDUCTOR DEVICE

PRIORITY DATA

The present application is a continuation application of U.S. patent application Ser. No. 13/745,446, filed Jan. 18, 2013, which is a divisional application of U.S. patent application Ser. No. 12/371,672, filed Feb. 16, 2009, issued as U.S. Pat. No. 8,357,617, which claims priority to Provisional Application Ser. No. 61/091,159 filed on Aug. 22, 2008, entitled "METHOD OF PATTERNING A METAL GATE OF SEMICONDUCTOR DEVICE", each of which is hereby incorporated by reference in its entirety.

BACKGROUND

The present disclosure relates generally an integrated circuit device and, more particularly, a method of patterning a gate structure of an IC device.

As technology nodes decrease, semiconductor fabrication processes have introduced the use of gate dielectric materials having a high dielectric constant (e.g., high-k dielectrics). The high-k dielectrics exhibit a higher dielectric constant than the traditionally used silicon dioxide which allows for thicker dielectric layers to be used to obtain similar equivalent oxide thicknesses (EOTs). The processes also benefit from the introduction of metal gate structures providing a lower resistance than the traditional polysilicon gate structures.

However, the fabrication processes providing for use of a high-k dielectric plus metal gate structure face challenges. For example, problems arise in using conventional photolithography techniques to pattern high-k metal gate structures. Traditional methods to remove masking elements (e.g., dry ash and wet etch processes to remove photoresist) may damage the underlying high-k gate dielectric film and/or the metal gate films. Furthermore, the formation of a photoresist feature directly on a metal film which is to be patterned may raise challenges. For example, photoresist peeling may occur due to poor adhesion between the photoresist and metal.

Therefore, what is needed is an improved method of patterning a metal gate structure.

BRIEF DESCRIPTION OF THE DRAWINGS

FIGS. 2, 3, 4a, 4b, 5, and 6 are cross-sectional views of a semiconductor device corresponding to the steps of an embodiment of the method of FIG. 1.

FIGS. 8-11 are cross-sectional views of a semiconductor device corresponding to steps of an embodiment of the method of FIG. 7.

FIGS. 13-17 are cross-sectional views of a semiconductor device corresponding to steps of an embodiment of the method of FIG. 7.

DETAILED DESCRIPTION

Figure 1:
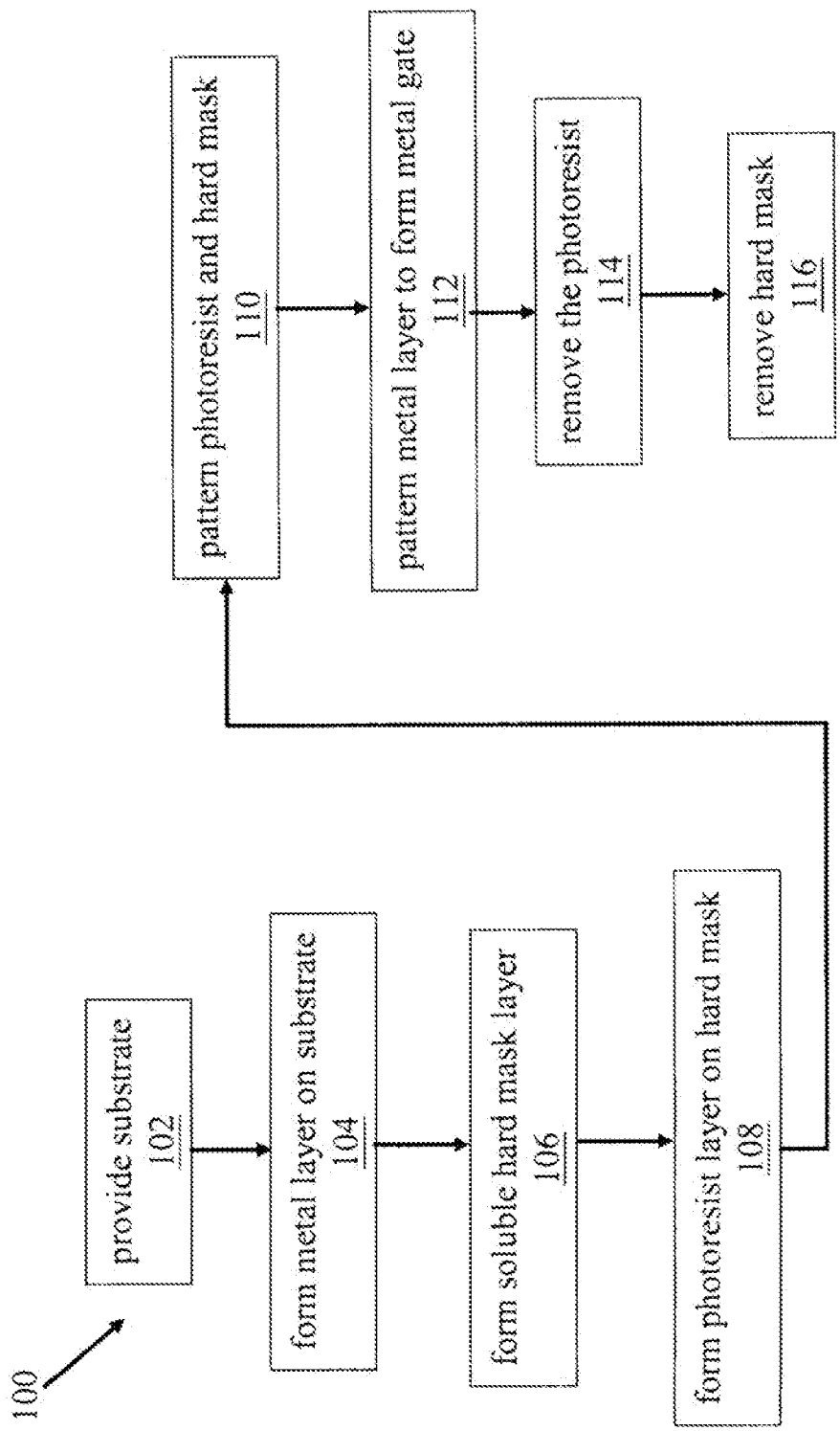
FIG. 1 is a flowchart illustrating an embodiment of a method of forming a gate structure using a soluble hard mask.

The present disclosure relates generally to forming an integrated circuit device and, more particularly, to patterning a metal gate structure of a semiconductor device (e.g., a FET device of an integrated circuit). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, included are descriptions of a first layer or feature "on" or "overlying" (as well as similar descriptions) a second layer or feature. These terms include embodiments where the first and second layer is in direct contact and those where one or more layers or feature are interposing the first and second layer. Further still, the exemplary embodiments are for illustrative purposes and not intended to be limiting, for example, numerous configurations of high-k metal gate structures are known in the art, including layers which may or may not be distinctly described herein but would be readily recognizable by one skilled in the art.

Referring to FIG. 1, illustrated is a flowchart providing an embodiment of a method 100 of forming a gate structure. FIGS. 2, 3, 4a, 4b, 5, and 6 provide exemplary devices corresponding to the fabrication steps of the method 100. The method 100 may be included during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, combinations thereof, and/or other semiconductor devices.

The method 100 begins at step 102 where a substrate (e.g., wafer) is provided. In the example of FIG. 2, a substrate 202 is provided. In an embodiment, the substrate 202 includes a silicon substrate in crystalline structure. The substrate 202 may include various doping configurations depending on design requirements as is known in the art (e.g., p-type substrate or n-type substrate) Other examples of the substrate 202 include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure. Further still, the substrate 202 may include a plurality of features formed thereon, including active regions, source and drain regions in the active regions, isolation regions (e.g., shallow trench isolation (STI) features), and/or other features known in the art. The STI feature 204 is formed on the substrate 202 separating (e.g., isolating) a first active region 206 and a second active region 208. The STI feature 204 formed in the substrate 202. The STI feature 204 may include silicon oxide, silicon nitride, silicon oxynitride, fluoride-doped silicate glass (FSG), and/or a low-k dielectric material. Other isolation methods and/or features are possible in lieu of or in addition to STI. The STI feature 204 may be formed using processes such as reactive ion etch (RIE) of the substrate 202 to form a trench which is filled with insulator material using deposition processes known in the art, followed by CMP processing. In an embodiment, the first active region 206 includes a portion of the substrate 202 in which a PMOS device will be formed; the second active region 208 includes a portion of the substrate 202 in which an NMOS device will be formed, though any configuration is possible.

In the exemplary embodiment of FIG. 2, a gate dielectric layer 210 and a capping layer 212 are formed on the substrate 202. However, numerous configurations are possible. The gate dielectric layer 210 may include an interface layer and a high-k gate dielectric layer. The interface layer may include silicon, oxygen, and/or nitrogen. In an embodiment, the interface layer is $SiO_2$. The interface layer may include a thickness of approximately 6 to 8 angstroms, though various other thicknesses may be suitable. The interface layer may be formed by atomic layer deposition (ALD) and/or other suitable processes. In an embodiment, gate dielectric layer 210 includes a high-k (high dielectric constant) material. The high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high k-gate dielectric layer 210 may be formed by ALD, chemical vapor deposition (CVD), and/or other suitable processes. In an embodiment, the thickness of the high-k gate dielectric is between approximately 10 and 30 angstroms (A).

The capping layer 212 may include a work function dielectric for tuning a work function of a metal layer (e.g., providing the metal gate electrode). The tuning of the work function may allow for the metal gate to properly function as part of an NMOS or PMOS transistor device. The capping layer 212 may include aluminum or lanthanium based-dielectrics, and/or other suitable compositions. In an embodiment, the interface layer and/or the capping layer 212 may be omitted, and/or other suitable layers may be included on the substrate 202.

The method 100 then proceeds to step 104 where a metal layer is formed on the substrate. The metal layer may be such that, when patterned it forms a metal gate electrode, or portion thereof. In an embodiment, the metal layer includes a work function metal such that it provides an N-metal work function or P-metal work function of a metal gate. Referring to the example of FIG. 2, a metal layer 214 is formed on the substrate 202. The metal layer 214 may include one or more layers including Ti, TiN, TaN, Ta, TaC, TaSiN, W, WN, MoN, MoON, $RuO_2$, and/or other suitable materials. The metal layer 214 may include one or more layers formed by physical vapor deposition (PVD), CVD, ALD, plating, and/or other suitable processes. Examples of work function metals that may be included in the metal layer 214 include p-type work function metal materials and n-type work function metal materials. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

The method 100 then proceeds to step 106 where a hard mask layer is formed on the substrate, overlying the metal layer, described above with reference to step 104. The hard mask layer includes a composition such that it is soluble and thus, removable from the substrate. The hard mask layer may be soluble in at least one of water, low concentration acid, or a base solution such as, a developer. The solubility of the hard mask allows it to be removed in-situ with (e.g., a substantially the same time as) a photoresist layer, such as described below with reference to step 110. The hard mask layer may be formed by physical vapor deposition, chemical vapor deposition, and/or other suitable processes. The hard mask layer may include a thickness between approximately 10 and 30 A. In an embodiment, the hard mask layer is 20 A. The hard mask layer may include a single layer or a multiple layer structure. Referring to the example of FIG. 2, a hard mask layer 216 is formed. The composition of the hard mask layer 216 may be such that it is removed by water, a weak acid, a base solution such as, a photoresist developer, and/or combinations thereof. The hard mask layer 216 may include a plurality of layers.

In an embodiment, the hard mask layer 216 includes a dielectric composition that is removable by water. Examples of suitable compositions include La containing dielectrics such as, $La_2O_3$. In an embodiment, the hard mask layer 216 includes a dielectric composition that is removable by a base solution. The base solution may include photoresist developers known in the art, including, for example, tetra-methyl-ammonium-hydroxide (TMAH) photoresist developer solution. Examples of suitable dielectrics include Al containing dielectrics such as, $Al_2O_3$.

The method 100 then proceeds to step 108 where a photoresist layer is formed on the hard mask. The photoresist layer may be spun-on and/or deposited by other suitable methods. Though illustrated herein as a positive tone resist, use of a negative resist is also possible. Referring to the example of FIG. 2, the photoresist layer 218 is formed.

The method 100 then proceeds to step 110 where the photoresist layer and the hard mask layer are patterned. The photoresist layer is patterned using suitable processes known in the art. For example, referring to the example of FIG. 2, the photoresist layer 218 is exposed to a pattern by a passing a radiation beam 220 through a photomask. The radiation beam 220 may be ultraviolet and/or can be extended to include other radiation beams such as ion beam, x-ray, extreme ultraviolet, deep ultraviolet, and other proper radiation energy. A post-exposure bake (PEB) is typically performed to allow the exposed photoresist polymers to cleave. The substrate including the cleaved polymer photoresist is then transferred to a developing chamber to remove the exposed photoresist, which is soluble to an aqueous developer solution. Typically, a developer solution such as tetra-methyl ammonium hydroxide (TMAH) is applied to the resist surface in the form of a puddle to develop the exposed photoresist. A de-ionized (DI) water rinse may then applied to the substrate to remove the dissolved polymers of the photoresist. A drying process (e.g., a spin dry process) may follow.

The hard mask 216 may also be patterned substantially simultaneously to (e.g., serially within the same process) and/or in-situ with the fabrication of the photoresist pattern. In an embodiment, the hard mask 216 is removable by a base solution (e.g., a developer). In the embodiment, as the developer is applied to the photoresist 218, the exposed portion of the photoresist is removed by the developer, exposing (e.g., opening) a portion of the underlying hard mask layer 216. The hard mask 216 being removable (e.g., soluble) in the developer is removed from the substrate—in the portions contacting the developer (e.g., underlying the soluble photoresist 218a). Thus, referring to the example of FIG. 3, the device 300 is provided including the patterned photoresist 304 and the patterned hard mask 302.

In an embodiment, the hard mask 216 is removable by water. In the embodiment, an exposed portion of the photoresist 218a is removed by the development process, thus exposing (e.g., opening) a portion of the underlying hard mask layer 216. A rinse may follow the development process and/or the development process itself may include water. The hard mask 216 being removable (e.g., soluble) in water is then removed from the substrate 202—in the portions not protected by the remaining photoresist pattern (e.g., underlying the soluble photoresist 218a). Thus, also referring to the example of FIG. 3, the device 300 is provided including the patterned photoresist 304 and the patterned hard mask 302.

The method 100 then proceeds to step 112 where the metal layer is patterned. The metal layer may be patterned to form a metal gate. In an embodiment, the metal layer includes a work function metal. One or more layers underlying the metal layer may also be patterned.

In an embodiment, the patterned photoresist and the patterned hard mask provide a masking element used to pattern the metal layer. Such an embodiment, is illustrated in the example of FIG. 4a. The metal gate 402 (formed of the metal layer 214) and patterned capping layer 404 (formed of the capping layer 212) are formed using a masking element including the photoresist pattern 304 and the hard mask layer 302. The method 100 then proceeds to step 114 where the photoresist is removed from the substrate. Referring to the example of FIG. 5, the photoresist is removed and the patterned hard mask 302, metal gate 402 and patterned capping layer 404 are disposed on the substrate 202. In an embodiment, the underlying gate dielectric layer 210 may also be patterned.

In an alternative embodiment of the method 100, in step 112, the patterned photoresist is removed, and the patterned hard mask provides a masking element used to pattern the metal layer. Such an embodiment is illustrated in the example of FIG. 4b. The photoresist 304 has been removed from the substrate 202 and the patterned hard mask 302 remains and is used as a masking element to remove portions of the metal layer 214. Referring to FIG. 5, the patterned hard mask 302 is used as a masking element to provide the patterned metal gate 402 and patterned capping layer 404 disposed on the substrate 202. In an embodiment, the underlying gate dielectric layer 210 may also be patterned.

The method 100 then proceeds to step 116 where the hard mask is removed from the substrate. The hard mask may be removed by wet etching, dry etching, plasma processes, chemical mechanical polish (CMP), and/or other suitable processes. In an embodiment, the hard mask includes a water soluble composition (e.g., $La_2O_3$) and may be removed by a water rinse. In an embodiment, the hard mask includes a base solution-soluble material (e.g., $Al_2O_3$) and may be removed by a base solution such as, a developer (e.g., TMAH).

Referring to the example of FIG. 6, the hard mask 302 is removed to provide the device 600 including the substrate 202 having the gate dielectric layer 210, the patterned capping layer 404 and the patterned metal gate 402. In an embodiment, the gate dielectric layer 210 is also patterned (e.g., removed from the second active region 208). The metal gate 402 provides a metal gate electrode, or portion thereof, of a transistor in the active region 206 of the substrate 202. In an embodiment, the metal gate 402 provides a metal gate of an NMOS transistor, while the metal layer (e.g., metal layer 214) is remove from the active region 204 (e.g., where a PMOS transistor may be formed).

The method 100 may continue to include processes that form a metal gate on the region 208 of the substrate (e.g., a PMOS transistor metal gate). In an embodiment, a second metal layer, for example, a P-metal work function layer is formed on the substrate. The second metal layer may be conformally deposited over the substrate 202 including overlying the metal gate 402. A chemical mechanical polish (CMP) process may be used to reduce and/or eliminate the second metal layer overlying the metal gate 402. In an embodiment, a thin portion of the second metal layer may remain over the metal gate 402, but minimally effect the work function of the metal gate 402. Alternatively, the CMP process may planarize the second metal layer such that the top surface of the second metal layer is co-linear with the top surface of the metal gate 402, the second metal layer being present only in the active area 208. In an embodiment, photolithography processes, such as those described above, may be used to form a second metal gate in the active area 208.

The method 100 may be included in a "gate first" or "gate last" fabrication process. In a gate last process, a dummy gate structure (e.g., a sacrificial polysilicon gate) may be formed over a gate dielectric and/or the work function metal layer. The dummy gate structure is then removed to form a trench within which a gate electrode or portion thereof may be formed.

The method 100 may provide benefits over conventional processes such as, improved adhesion of a photoresist layer. Forming a photoresist layer directly on the metal layer may provide for poor adhesion of the photoresist to the metal leading to issues such as photoresist peeling. In contrast, formation of the photoresist of the method 100 on a hard mask layer may provide improved adhesion. Furthermore, use of conventional hard masks may cause issues with removal of the hard mask, for example, metal gate oxidation, high-k dielectric and/or metal gate damage, and/or other issues. One or more of these issues may be improved by the use of a soluble-hard mask.

Figure 7:
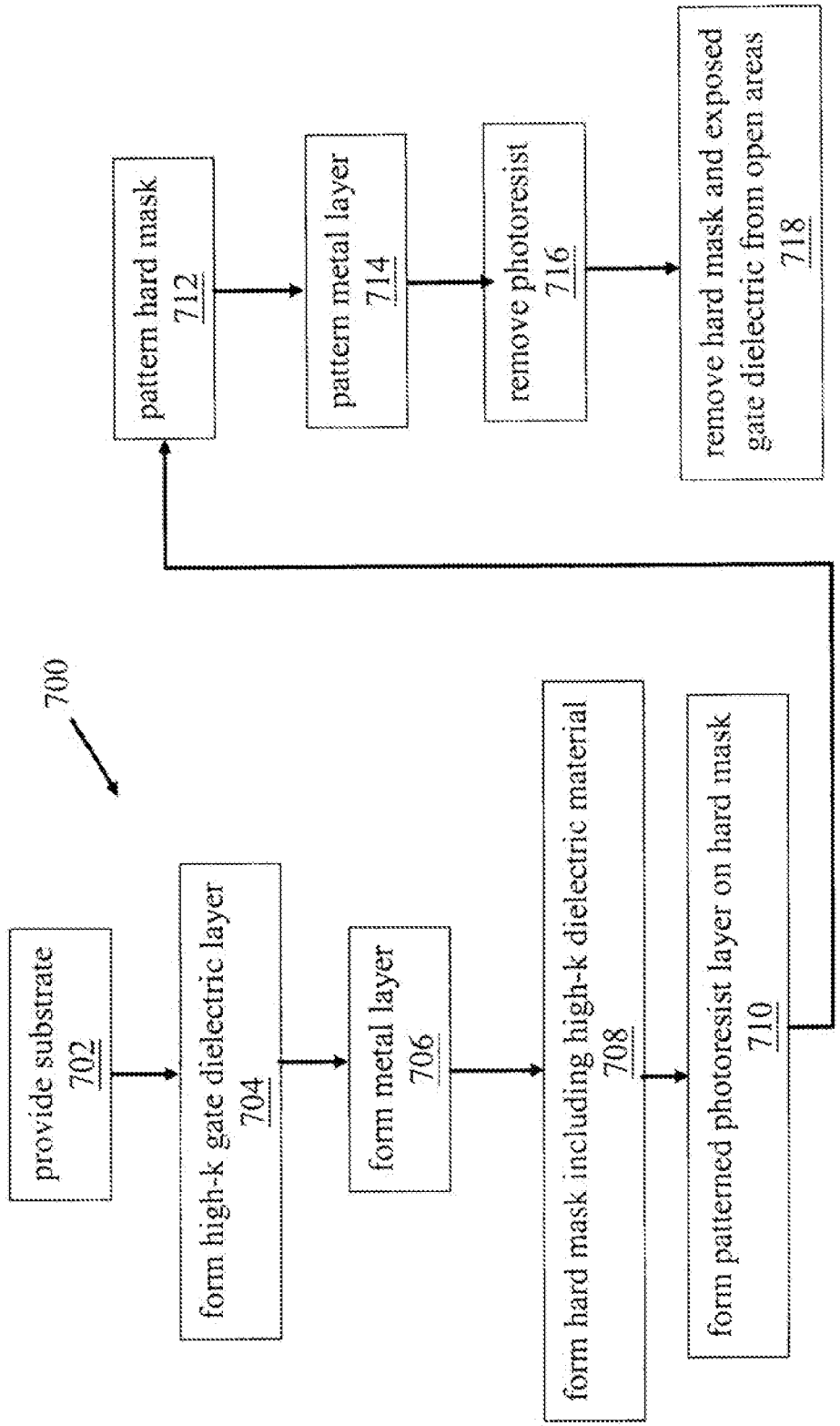
FIG. 7 is a flowchart illustrating an embodiment of a method of forming a gate structure using a high-k dielectric hard mask.

Referring now to FIG. 7, illustrated is a method 700 for patterning of a gate structure. The method 700 may be used to form a metal gate structure having a high-k dielectric. FIGS. 8-11 provide exemplary embodiments of a semiconductor device according to the fabrication steps of the method 700. The method begins at step 702 where a substrate is provided. Referring to the example of FIG. 8, the substrate 802 is provided. The substrate 802 may be substantially similar to the substrate 202 described above with reference to FIG. 2. The STI structure 804 may be substantially similar to the STI structure 204, also described above with reference to FIG. 2, and isolates two active regions of the substrate 202, region 806 and 808.

The method 700 then proceeds to step 704 where a gate dielectric layer is formed on the substrate. The gate dielectric layer may include a high-k dielectric material. Referring to the example of FIG. 8, the high-k gate dielectric layer 810 is formed on the substrate 802. The high-gate dielectric layer 810 may be substantially similar to gate dielectric layer 210, described above with reference to FIG. 2. In an embodiment, an interface layer is formed underlying the high-k gate dielectric layer. The interface layer may include a thickness between 5 and 10 Angstroms. The interface layer may include silicon, oxygen, nitride, and/or other suitable materials. In an embodiment, the interface layer includes SiO2.

The method 700 then proceeds to step 706 where a metal layer is formed on the substrate. The metal layer may be used form a metal gate, or portion thereof. In an embodiment, the metal layer includes p or n-work function metal. Referring to the example of FIG. 8, the metal layer 812 is formed. The metal layer 812 may be substantially similar to the metal layer 214 described above with reference to FIG. 2. For example, the metal layer 812 may include a plurality of metal layers one or more of which is used in forming a metal gate.

The method 700 then proceeds to step 708 where a hard mask layer is formed on the substrate. The hard mask layer may be a single layer or multiple layer feature. The hard mask layer includes a high-k dielectric material. Examples of high-k dielectrics include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The hard mask layer may be formed by ALD, CVD, and/or other suitable processes. The hard mask layer may include the same composition as the gate dielectric, described above with reference to step 704, or a different composition. In an embodiment, the composition of the hard mask layer and the gate dielectric are selected such that they provide different etch rates. Referring to the example of FIG. 8, the hard mask layer 814 is formed. The hard mask layer 814 includes a high-k dielectric material. In an embodiment, the hard mask layer 814 includes a thickness of approximately 12 Angstroms. The hard mask layer 814 may be substantially the same thickness as the gate dielectric layer 810.

The method 700 then proceeds to step 710 where a patterned photoresist layer is formed on the substrate. A photoresist layer may be spun-on and/or deposited by other suitable methods. The resist may be positive or negative tone. The photoresist layer is patterned using suitable processes known in the art. For example, the photoresist layer is exposed to a pattern by a passing a radiation beam through a photomask. The radiation beam may be ultraviolet and/or can be extended to include other radiation beams such as ion beam, x-ray, extreme ultraviolet, deep ultraviolet, and other proper radiation energy. A post-exposure bake (PEB) is typically performed to allow the exposed photoresist polymers to cleave. The substrate including the cleaved polymer photoresist is then transferred to a developing chamber to remove the exposed photoresist, which is soluble to an aqueous developer solution. Typically, a developer solution such as tetra-methyl ammonium hydroxide (TMAH) is applied to the resist surface in the form of a puddle to develop the exposed photoresist. A de-ionized (DI) water rinse may then applied to the substrate to remove the dissolved polymers of the photoresist. A drying process (e.g., a spin dry process) may follow. Referring to the example of FIG. 8, the photoresist pattern 816 is formed. The photoresist pattern 816 may define a pattern providing for a metal gate (e.g., metal gate electrode).

The method 700 then proceeds to step 712 where the hard mask layer is patterned. The hard mask layer may be patterned using the photoresist pattern, described above with reference to step 710, as a masking element. Referring to the example of FIG. 9, the patterned hard mask layer 902 is formed.

The method 700 then proceeds to step 714 where the metal layer is patterned. In an embodiment, the metal layer is patterned in-situ and substantially simultaneously with the patterning of the hard mask. The metal layer may be patterned (e.g., etched) using a masking element including the photoresist pattern. The metal layer may be removed using a wet etch, dry etch, plasma, and/or other suitable processes. Referring to the example of FIG. 9, the metal gate 904 is provided (by patterning the metal layer 812).

The method 700 then proceeds to step 716 where the photoresist pattern is removed from the substrate. The photoresist may be removed (e.g., stripped) from the substrate using wet etch, dry etch, dry ash, and/or other suitable processes. Referring to the example of FIG. 10, the photoresist pattern is removed from the substrate 802 providing a gate dielectric layer 810, metal gate 904, and overlying patterned hard mask 902.

The method 700 then proceeds to step 716 where the hard mask is removed. In an embodiment, the gate dielectric layer not underlying the metal gate is also removed. The hard mask and/or gate dielectric layer may be removed using wet etch, dry etch, plasma, and/or other suitable treatments. The hard mask and gate dielectric may be removed at substantially the same rate (for example, if they comprise similar high-k dielectric compositions). In other embodiments, the hard mask may be removed and the gate dielectric layer may remain on the substrate. In an embodiment, the gate dielectric layer may be partially removed, for example, decreasing in thickness. In such an example, the gate dielectric layer may include a first thickness underlying the metal gate and provide a second thickness (e.g., less than the first thickness), in the open area of the substrate.

Referring to the example of FIG. 11, the hard mask 902 is removed and the gate dielectric 810 is removed to provide the patterned gate dielectric layer 1102 underlying the metal gate 904. The gate dielectric layer has been removed from the exposed (e.g., open) areas of the substrate including the region 808. In an embodiment, the region 806 provides an active area for formation of a PMOS or NMOS device including the metal gate 904, and the region 808 provides an active area for formation of the other of a PMOS or NMOS device.

The method 700 may continue to include processes that form a metal gate on the region 708 of the substrate (e.g., a PMOS transistor metal gate). In an embodiment, a second metal layer, for example, an N- or P-metal work function layer is formed on the substrate. The second metal layer may be conformally deposited over the substrate 702 including overlying the metal gate 402. A chemical mechanical polish (CMP) process may be used to reduce and/or eliminate the second metal layer overlying the metal gate 904. In an embodiment, a thin portion of the second metal layer may remain over the metal gate 904, but minimally effect the work function of the metal gate 904. Alternatively, the CMP process may planarize the second metal layer such that the top surface of the second metal layer forming the second gate is co-linear with the top surface of the metal gate 904, the second metal layer being present only in the active area 808. In an embodiment, photolithography processes, such as those described above, may be used to form a second metal gate in the active area 808. Underlying the second metal layer, a gate dielectric layer may be formed, or as described above in step 716 the gate dielectric layer (e.g., gate dielectric layer 810) may remain on the substrate in whole or in part, as the hard mask is selectively removed.

The method 700 may be included in a "gate first" or "gate last" fabrication process. In a gate last process, a dummy gate structure (e.g., a sacrificial polysilicon gate) may be formed over a gate dielectric. The dummy gate structure is then removed to form a trench within which a gate electrode may be formed.

The method 700 may provide benefits over conventional processes such as, improved adhesion of a photoresist layer. For example, adhesion of photoresist and a high-k dielectric hard mask may be greater than that between photoresist and a metal layer that is to patterned. The increased adhesion may provide for decreased instances of photoresist peeling (e.g., during wet processes). Further advantages may be seen by reduction of damage to the high-k gate dielectric and/or metal gate that may be caused by conventional dry ash and/or wet etch removal of a photoresist layer and/or hard mask.

Figure 12:
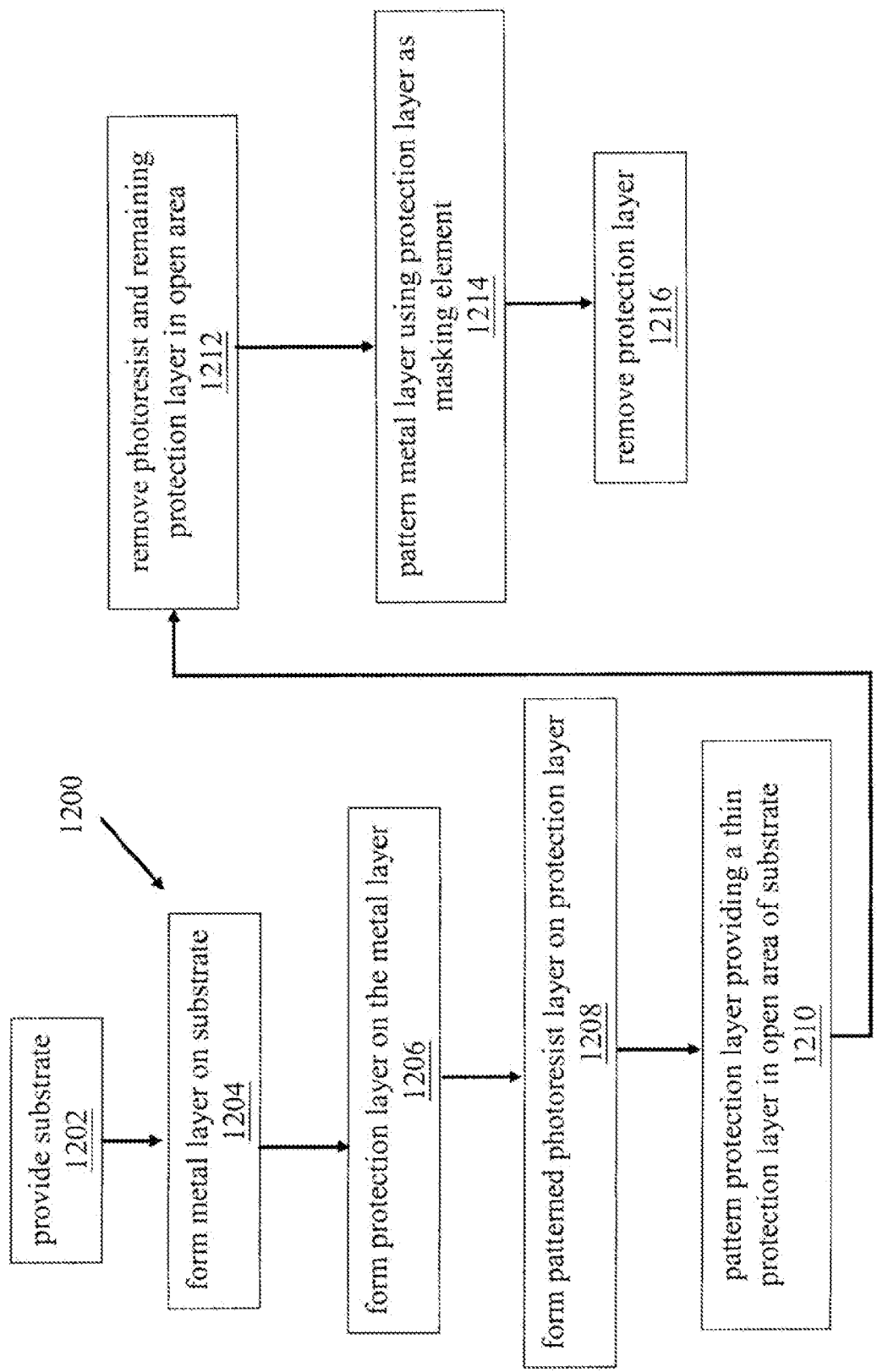
FIG. 12 is a flowchart illustrating an alternative embodiment of a method of forming a gate structure using a protection layer.

Referring now to FIG. 12, illustrated is a method 1200 for fabricating a gate structure. FIGS. 13-17 illustrate exemplary embodiments of a device corresponding to the steps of the method 1200. The method 1200 begins at step 1202 where a substrate is provided. Referring to the example of FIG. 13, a substrate 1302 is provided. The substrate 1302 may be substantially similar to the substrate 202 described above with reference to FIG. 2. The substrate 1302 includes a shallow trench isolation feature 1304 that isolates regions of the substrate 1302, such as a PMOS region and an NMOS region. The substrate 1302 includes a gate dielectric film 1310 and a metal layer 1312. Examples of suitable metals to be including the metal layer 1312 include TaN, TaSiN, W, TaC, TaCN, TiAlN, Al, TiN, and/or other suitable materials. In an embodiment, the metal layer 1312 has a thickness between approximately 10A and 200A. The gate dielectric film 1310 may be a high-k dielectric material including, for example, $HfO_2$, HfSiO, HfSiON, HfZrO, and/or other suitable materials. The gate dielectric film 1310 may be substantially similar to the gate dielectric layer 210, described above with reference to FIG. 2. In an embodiment, the gate dielectric film 1310 has a thickness between approximately 10 and 30 Angstroms.

The method 1200 then proceeds to step 1204 where a metal gate layer is formed on the substrate. The metal gate electrode layer may include a p-metal or n-metal composition and provide the work function of a metal gate. Referring to the example of FIG. 13, the metal gate layer 1314 is formed. The metal gate layer 314 may be substantially similar to the metal layer 214, described above with reference to FIG. 2. In an embodiment, the metal layer 1314 has a thickness between approximately 10 and 200 Angstroms. The metal layer 1314 may include one or more layers that provide a metal gate electrode or portion thereof.

The method 1200 then proceeds to step 1206 where a protection layer is formed on the substrate, overlying the metal layer. In an embodiment, the protection layer includes an oxide. Examples of suitable oxides include spin-on glass (SOG), teraethoxysilane (TEOS), PE-oxide (oxide formed by plasma enhanced processes, e.g., CVD), HARP oxide (e.g., dense thermally grown oxide), and/or other possible oxide materials. In an embodiment, the protection layer includes silicon. Examples of silicon compositions include polysilicon, amorphous silicon, and/or other suitable compositions. Referring to the example of FIG. 13, the protection layer 1316 is formed. In an embodiment, the protection layer 1316 has a thickness between approximately 100 and 200 Angstroms.

The method 1200 then proceeds to step 1208 where a patterned photoresist layer is formed on the protection layer. A photoresist layer may be spun-on and/or deposited by other suitable methods. The photoresist may be positive tone or negative tone resist. The formed photoresist layer is patterned using suitable processes known in the art. For example, the photoresist layer is exposed to a pattern by a passing a radiation beam through a photomask. The radiation beam may be ultraviolet and/or can be extended to include other radiation beams such as ion beam, x-ray, extreme ultraviolet, deep ultraviolet, and other proper radiation energy. A post-exposure bake (PEB) is typically performed to allow the exposed photoresist polymers to cleave. The substrate including the cleaved polymer photoresist is then transferred to a developing chamber to remove the exposed photoresist, which is soluble to an aqueous developer solution. Typically, a developer solution such as tetra-methyl ammonium hydroxide (TMAH) is applied to the resist surface in the form of a puddle to develop the exposed photoresist. A de-ionized (DI) water rinse may then applied to the substrate to remove the dissolved polymers of the photoresist. A drying process (e.g., a spin dry process) may follow. Referring to the example of FIG. 13, the patterned photoresist 1318 is formed. The patterned photoresist 1318 may provide a pattern associated with formation of a metal gate.

The method 1200 then proceeds to step 1210 where the protection layer is patterned using the patterned photoresist as a masking element. The protection layer may be patterned such a portion of the protection layer is removed from unmasked (e.g., open area) of the substrate. This provides a thin layer of protection layer remaining on the open areas (e.g., those not underlying the patterned photoresist, described above with reference to step 1212). The protection layer may be patterned using a wet etch. Other processes may be used to remove (pattern) the protection layer such as, dry etch, plasma etch, and/or other suitable methods. Referring to the example of FIG. 14, the patterned protection layer 1402 is provided. The patterned protection layer 1402 includes a thin layer of material overlying the open area of the substrate 1302, including over the active region 1306. The patterned protection layer 1402 has a first thickness tp1 underlying the patterned photoresist 1318 and a second thickness tp2 in the open area (e.g., unmasked) of the substrate 1302. In an embodiment, tp1 is a thickness between approximately 100 and 2000 Angstroms. In an embodiment, tp2 is a thickness between approximately 20 and 200 Angstroms. In a further embodiment, tp2 is a thickness between approximately 30 and 50 Angstroms.

The method 1200 then proceeds to step 1212 where the photoresist and unmasked, patterned protection layer are removed. The removal may include a wet etch process, such as, a wet etch including sulfuric acid-hydrogen peroxide solution (SPM) and/or a diluted hydrofluoric acid (DHF) (e.g., 1:50 to 1:1000 concentration). In an embodiment, a SPM process is followed by a DHF process. The SPM process may be between 30 seconds and 3 minutes, the DHF process may be between 10 seconds and 3 minutes, though numerous other embodiments are possible. A SPM and/or DHF process may be beneficial to provide removal of a protective film comprising an oxide. In an embodiment, a wet etch including SPM and $NH_4OH$ or TMAH is provided. This etch chemistry may provide for removal of a protection layer including a silicon layer (e.g., polysilicon or amorphous silicon). Referring to the example of FIG. 15, the patterned photoresist 1318 and the portion of the patterned protection layer 1402 not masked by the photoresist pattern 1318 has been removed, leaving the protection layer masking element 1502. The masking element 1502 may provide a masking element to pattern the metal layer 1314 to form a metal gate, or portion thereof, on the active region 1304.

The method 1200 then proceeds to step 1214 where the metal layer is patterned using the protection layer as a masking element. The metal layer may be patterned to form a metal gate (e.g., metal gate electrode) or portion thereof. The metal layer may be patterned using process such as wet etch, dry etch, plasma processes, and/or other suitable processes. In an embodiment, the metal layer is patterned using an ammonia hydroxide-hydrogen peroxide mixture (APM). Referring to the example of FIG. 16, the metal gate 1602 is formed. The metal gate 1602 may include a portion of metal gate (e.g., work function) for an NMOS or PMOS transistor formed in the region 1304 of the substrate 1302. In an embodiment, one or more of the underlying layers, such as the buffer layer 1312 and/or the gate dielectric layer 1310 are also patterned.

The method 1200 then proceeds to step 1216 where the remaining protection layer (e.g., patterned protection layer) is removed from the substrate. The protection layer may be removed using wet etch, dry etch, CMP, plasma, and/or other suitable processes. In an embodiment, the protection layer is removed using a wet etch process including diluted hydrofluoric acid (DHF). Referring to the example of FIGS. 16 and 17, the patterned protection layer 1502 is removed and the device 1700 is formed.

The method 1200 may continue to include processes that form a metal gate on the region 1306 of the substrate. In an embodiment, a second metal layer, for example, an N or P-metal work function layer is formed on the substrate. The second metal layer may be conformally deposited over the substrate 1302 including overlying the metal gate 1602. A chemical mechanical polish (CMP) process may be used to reduce and/or eliminate the second metal layer overlying the metal gate 1602. In an embodiment, a thin portion of the second metal layer may remain over the metal gate 1602, but minimally effect the work function of the metal gate 1602. Alternatively, the CMP process may planarize the second metal layer such that the top surface of the second metal layer (the second metal gate) is co-linear with the top surface of the metal gate 1602, the second metal layer being present only in the active area 1306. In an embodiment, photolithography processes, such as those described above, may be used to form a second metal gate in the active area 1306.

The method 1200 may be included in a "gate first" or "gate last" fabrication process. In a gate last process, a dummy gate structure (e.g., a sacrificial polysilicon gate) may be formed over a gate dielectric. The dummy gate structure is then removed to form a trench within which a gate electrode may be formed.

The method 1200 may provide benefits over conventional processes such as, improved adhesion of a photoresist layer. For example, adhesion of photoresist and a protection layer may be greater than that between photoresist and a metal layer that is to patterned. The increased adhesion may provide for decreased instances of photoresist peeling (e.g., during wet etch processes). Further advantages may be seen by reduction of damage to the high-k gate dielectric and/or metal gate that may be caused by conventional dry ash and/or wet etch removal of a photoresist layer. The protection layer, for example, including the protection layer of thickness tp2 overlying the region 1306 of the substrate, may protect the high-k dielectric 1312 and/or the metal layer 1314 from a process used to strip the photoresist 1318.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method comprising:
    forming a dielectric layer over a first region and a second region of a substrate;
    forming a first metal layer directly on the dielectric layer in the first and second regions;
    forming a second metal layer directly on the first metal layer in the first and second regions;
    forming a protection layer over the metal layer in the first and second regions;
    removing a first portion of the protection layer in the second region to expose the second metal layer in the second region;
    removing the exposed second metal layer in the second region;
    removing the protection layer in the first region to expose the second metal layer in the first region; and
    forming a third metal layer directly on the exposed second metal layer in the first region and directly on the first metal layer in the second region.

2. The method of claim 1, further comprising removing a second portion of the protection layer in the second region to expose the first portion of the protection layer in the second region.

3. The method of claim 2, wherein removing the first portion of the protection layer includes performing a first etching process and wherein removing the second portion of the protection layer in the second region to expose the first portion of the protection layer in the second region includes performing a second etching process that is different than the first etching process.

4. The method of claim 1, wherein the second metal layer includes a first type work function metal layer and wherein the third metal layer includes a second type work function metal layer that is opposite the first type function metal layer.

5. The method of claim 1, wherein removing the protection layer in the first region to expose the second metal layer in the first region includes performing a chemical mechanical polishing process to remove the protection layer in the first region.

6. The method of claim 1, wherein removing the protection layer in the first region to expose the second metal layer in the first region includes performing an etching process to remove the protection layer in the first region.

7. A method comprising:
    forming a high-k dielectric layer over a first region and a second region of a substrate;
    forming a metal layer over the first high-k dielectric layer in the first and second regions;
    forming a protection layer over the metal layer in the first and second regions of the substrate;
    removing a portion of the protection layer in the second region such that the protection layer has a first thickness in the first region and a second thickness in the second region that is different than the first thickness;
    after removing the portion of the protection layer in the second region, removing a remaining portion of the protection layer in the second region to expose the metal layer in the second region;
    removing the exposed metal layer in the second region of the substrate;
    removing the protection layer in the first region to expose to the metal layer in the first region; and
    forming another metal layer directly on the exposed metal layer in the first region and over the high-k dielectric layer in the second region.

8. The method of claim 7, further comprising forming a barrier metal layer over the high-k dielectric layer in the first and second regions of the substrate prior to forming the protection layer over the metal layer in the first and second regions of the substrate.

9. The method of claim 8, wherein forming the another metal layer directly on the exposed metal layer in the first region and over the high-k dielectric layer in the second region further includes forming the another metal layer directly on the barrier metal layer in the second region of substrate.

10. The method of claim 7, wherein the protection layer includes an oxide material.

11. The method of claim 7, wherein the protection layer includes silicon.

12. The method of claim 7, wherein the metal layer includes a first type work function metal layer and wherein the another metal layer includes a second type work function metal layer that is opposite the first type function metal layer.

13. The method of claim 7, wherein removing the exposed metal layer from the second region of the substrate occur prior to removing the protection layer in the first region to expose to the metal layer in the first region.

14. A method of fabricating a semiconductor device, comprising:
- forming a metal layer on a semiconductor substrate;
- forming a protection layer on the metal layer;
- removing a portion of the protection layer to provide a first region having a first thickness and a second region having a second thickness, wherein the first region is underlying a photoresist masking element;
- removing the photoresist masking element;
- removing the second region of the protection layer from the substrate after removing the photoresist masking element; and
- patterning the metal layer using the first region of the protection layer.

15. The method of claim 14, wherein the second thickness is approximately 30 and 50 Angstroms.

16. The method of claim 14, wherein the patterning the metal layer includes forming at least a portion of a metal gate.

17. A method of claim 14, further comprising:
- depositing a high-k dielectric layer on the semiconductor substrate underlying the metal layer.

18. The method of claim 14, wherein the protection layer includes an oxide.

19. The method of claim 18, wherein the protection layer is selected from the group consisting of: include spin-on glass (SOG), teraethoxysilane (TEOS), PE-oxide, and HARP oxide.

20. The method of claim 14, wherein the protection layer includes silicon.

* * * * *